US010152011B2

(12) United States Patent
Nishikata et al.

(10) Patent No.: US 10,152,011 B2
(45) Date of Patent: Dec. 11, 2018

(54) IMAGE FORMING SYSTEM INCLUDING PUNCHING UNIT

(71) Applicant: CANON KABUSHIKI KAISHA, Tokyo (JP)

(72) Inventors: Akinobu Nishikata, Abiko (JP); Yutaka Ando, Toride (JP); Akihiro Arai, Toride (JP); Hiromasa Maenishi, Matsudo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/696,738

(22) Filed: Sep. 6, 2017

(65) Prior Publication Data

US 2017/0364018 A1 Dec. 21, 2017

Related U.S. Application Data

(63) Continuation of application No. 15/230,958, filed on Aug. 8, 2016, now Pat. No. 9,785,105.

(30) Foreign Application Priority Data

Aug. 19, 2015 (JP) ................................ 2015-162096

(51) Int. Cl.
*G03G 15/00* (2006.01)

(52) U.S. Cl.
CPC ....... *G03G 15/6582* (2013.01); *G03G 15/553* (2013.01); *H05K 999/99* (2013.01); *G03G 2215/00818* (2013.01)

(58) Field of Classification Search
CPC ................................................. G03G 15/6582
USPC ......................................................... 399/407
See application file for complete search history.

(56) References Cited

U.S. PATENT DOCUMENTS 4,570,229 A * 2/1986 Breen .................. B30B 11/005 264/40.1
5,419,169 A * 5/1995 Kirii ...................... B21D 24/10 72/16.1
5,699,546 A 12/1997 Nishikata et al.
7,627,282 B2 12/2009 Oka et al.
2002/0071135 A1 6/2002 Takeda et al.
(Continued)

OTHER PUBLICATIONS

Notice of Allowance issued in U.S. Appl. No. 15/230,958 dated Jun. 9, 2017.

*Primary Examiner* — Anthony Nguyen
(74) *Attorney, Agent, or Firm* — Rossi, Kimms & McDowell LLP

(57) ABSTRACT

An image forming system capable of properly managing maintenance information on a punch die mounted on a puncher. The puncher punches holes in a sheet using a removably mounted punch die. A punch die memory mounted on the punch die stores maintenance information concerning the punch die. A CPU of the image forming system detects mounting of a punch die. A RAM of the same stores maintenance information concerning each of punch dies mounted on the puncher. When a punch die is mounted on the puncher, the CPU performs comparison between maintenance information is stored in the RAM, and maintenance information stored in the punch die memory, and when the maintenance information stored in the RAM is older, the CPU updates the information in the RAM to the information in the punch die memory.

10 Claims, 18 Drawing Sheets

(56) References Cited

U.S. PATENT DOCUMENTS

| | | | | |
|---|---|---|---|---|
| 2002/0083815 | A1 | 7/2002 | Whiteman et al. | |
| 2002/0124699 | A1 | 9/2002 | Ishii et al. | |
| 2005/0271445 | A1 | 12/2005 | Hanada et al. | |
| 2007/0186744 | A1 * | 8/2007 | Lee | B21D 37/04 83/563 |
| 2007/0240470 | A1 * | 10/2007 | Suzuki | B21D 22/20 72/14.9 |
| 2010/0266197 | A1 | 10/2010 | Whiting | |
| 2011/0008089 | A1 | 1/2011 | Watanabe et al. | |
| 2013/0231770 | A1 * | 9/2013 | Cole | B21D 22/02 700/159 |

* cited by examiner

*FIG. 11A*

| | |
|---|---|
| SHEET ID | XXX |
| SHEET WIDTH [mm] | YYY |
| SHEET LENGTH [mm] | ZZZ |
| BASIS WEIGHT [gsm] | GGG |
| PUNCH SETTING | ON |
| SHEET TYPE | PLAIN PAPER |
| LAST-SHEET FLAG | ON/OFF |
| ⋮ | |

SHEET INFORMATION SENT FROM IMAGE FORMING APPARATUS TO PUNCHER WHEN IN PUNCHING MODE

*FIG. 11B*

| | |
|---|---|
| SHEET ID | XXX |
| SHEET WIDTH [mm] | YYY |
| SHEET LENGTH [mm] | ZZZ |
| BASIS WEIGHT [gsm] | GGG |
| PUNCH SETTING | OFF |
| SHEET TYPE | PLAIN PAPER |
| LAST-SHEET FLAG | ON/OFF |
| ⋮ | |

SHEET INFORMATION SENT FROM IMAGE FORMING APPARATUS TO PUNCHER WHEN NOT IN PUNCHING MODE

*FIG. 16A*

| |
|---|
| DIE ID |
| DIE NO. |
| TOTAL COUNTER |
| LUBRICATION EXECUTION-TIME COUNTER |

FORMAT OF PUNCH DIE INFORMATION STORED IN PUNCH DIE MEMORY

*FIG. 16B*

| |
|---|
| ID20 |
| CCCCC |
| 2000,000 |
| 1600,000 |

LUBRICATION EXECUTION TIME (DIE MEMORY)

*FIG. 16C*

| |
|---|
| ID20 |
| CCCCC |
| 2000,000 |
| 2000,000 |

LUBRICATION EXECUTION TIME (SELF-APPARATUS)

*FIG. 16D*

| |
|---|
| ID20 |
| CCCCC |
| 2000,000 |
| 2000,000 |

AFTER MEMORY INFORMATION UPDATE (DIE MEMORY)

*FIG. 16E*

| |
|---|
| ID20 |
| CCCCC |
| 2000,000 |
| 2000,000 |

AFTER MEMORY INFORMATION UPDATE (SELF-APPARATUS)

*FIG. 16F*

| |
|---|
| ID20 |
| CCCCC |
| 2100,000 |
| 1600,000 |

WHEN USED IN ANOTHER APPARATUS AFTER LUBRICATION (DIE MEMORY)

*FIG. 16G*

| |
|---|
| ID20 |
| CCCCC |
| 2000,000 |
| 2000,000 |

WHEN USED IN ANOTHER APPARATUS AFTER LUBRICATION (SELF-APPARATUS)

*FIG. 16H*

| |
|---|
| ID20 |
| CCCCC |
| 2100,000 |
| 2000,000 |

AFTER UPDATE OF MEMORY INFORMATION IN SELF-APPARATUS AFTER USE IN ANOTHER APPARATUS (DIE MEMORY)

*FIG. 16I*

| |
|---|
| ID20 |
| CCCCC |
| 2100,000 |
| 2000,000 |

AFTER UPDATE OF MEMORY INFORMATION IN SELF-APPARATUS AFTER USE IN ANOTHER APPARATUS (SELF-APPARATUS)

IMAGE FORMING SYSTEM INCLUDING PUNCHING UNIT

BACKGROUND OF THE INVENTION

Field of the Invention

The present invention relates to an image forming system including a punching unit having a punch die removably mounted thereon for forming punched holes in a sheet.

Description of the Related Art

Conventionally, there has been known an image forming apparatus including a post-processing apparatus for forming punched holes in a sheet (see U.S. Pat. No. 7,627,282).

U.S. Pat. No. 7,627,282 proposes an image forming system including a punching device (puncher) as a post-processing apparatus for forming punched holes in the leading end, as viewed in a sheet conveying direction, of a sheet discharged from an image forming apparatus.

Such a puncher as mentioned above has a structure configured such that a desired one of a plurality of punch dies different e.g. in the shape or the number of punch holes can be selectively mounted thereon.

Incidentally, in order to maintain the durability of a punch die which is mounted in a puncher, it is preferable to perform periodical lubrication, and it is required to perform proper management of lubrication timing.

For this reason, conventionally, a puncher which has a punch die mounted thereon is provided with a counter for managing punch dies on a die type-by-die type basis, and timing for lubrication of each punch die or exchange of punch dies is managed based on the count of the counter.

For a puncher in which a punch die can be exchangeably mounted, so as to properly manage the timing for lubrication of each punch die or exchange of punch dies, there is envisaged a method of mounting a nonvolatile memory on each of the punch dies, and storing lubrication information in each of the nonvolatile memories, for management.

However, to update the lubrication information stored in the nonvolatile memory (punch die memory) mounted on a punch die, it is necessary to mount the punch die in a puncher. On the other hand, lubrication work is performed in a state where the punch die is removed from the puncher.

More specifically, to update lubrication information stored in a punch die memory, a process is required in which, first, the punch die is mounted in the puncher so as to check the lubrication information, then the punch die is removed from the puncher for execution of lubrication work, and thereafter the punch die is mounted in the puncher again for update of the lubrication information.

As a consequence, work for managing memory information becomes complicated, and work time becomes long. Further, in a case where the same punch die is mounted in a plurality of punchers for use among them, there is a problem of occurrence of a situation in which it is impossible to properly manage lubrication information including the count of a counter and lubrication execution timing.

SUMMARY OF THE INVENTION

The present invention provides an image forming system capable of properly managing maintenance information of a punch die which is mounted in a puncher, without requiring any complicated operation.

The invention provides an image forming system comprising a punching unit configured to form punched holes in a sheet, using a punch die removably mounted thereon, a first memory, mounted on the punch die, configured to store maintenance information concerning the punch die, a detector configured to detect whether or not a punch die is mounted on the punching unit, a second memory configured to store maintenance information concerning punch dies mounted on the punching unit, on a punch die-by-punch die basis, and a controller configured to perform, when the detector detects that a punch die is mounted on the punching unit, comparison between maintenance information of the punch die, which is stored in the second memory, and maintenance information of the punch die, which is stored in the first memory, and update, when the maintenance information stored in the second memory is older than the maintenance information stored in the first memory, the maintenance information stored in the second memory to the maintenance information stored in the first memory.

According to the invention, when maintenance information stored in the second memory is older than maintenance information stored in the first memory mounted on a punch die, the old maintenance information stored in the second memory is updated to the new maintenance information stored in the first memory so as to make the two pieces of maintenance information identical to each other. This makes it possible to manage maintenance information on a punch die by the two memories, and hence the maintenance information concerning the punch die can be updated even in a state where the punch die is not currently mounted on the punching unit. Therefore, it is possible to properly manage maintenance information on a punch die which is mounted on the puncher, without requiring any complicated operation.

Further features of the present invention will become apparent from the following description of exemplary embodiments (with reference to the attached drawings).

BRIEF DESCRIPTION OF THE DRAWINGS

FIG. 11A is a view illustrating sheet information of a sheet discharged from an image forming apparatus in a punching mode.

FIG. 11B is a view illustrating sheet information of a sheet discharged from the image forming apparatus in a non-punching mode.

FIGS. 16A to 16I are views illustrating a format of punch die information stored in a punch die memory and examples of the punch die information in the format.

DESCRIPTION OF THE EMBODIMENTS

The present invention will now be described in detail below with reference to the accompanying drawings showing embodiments thereof.

Figure 1:
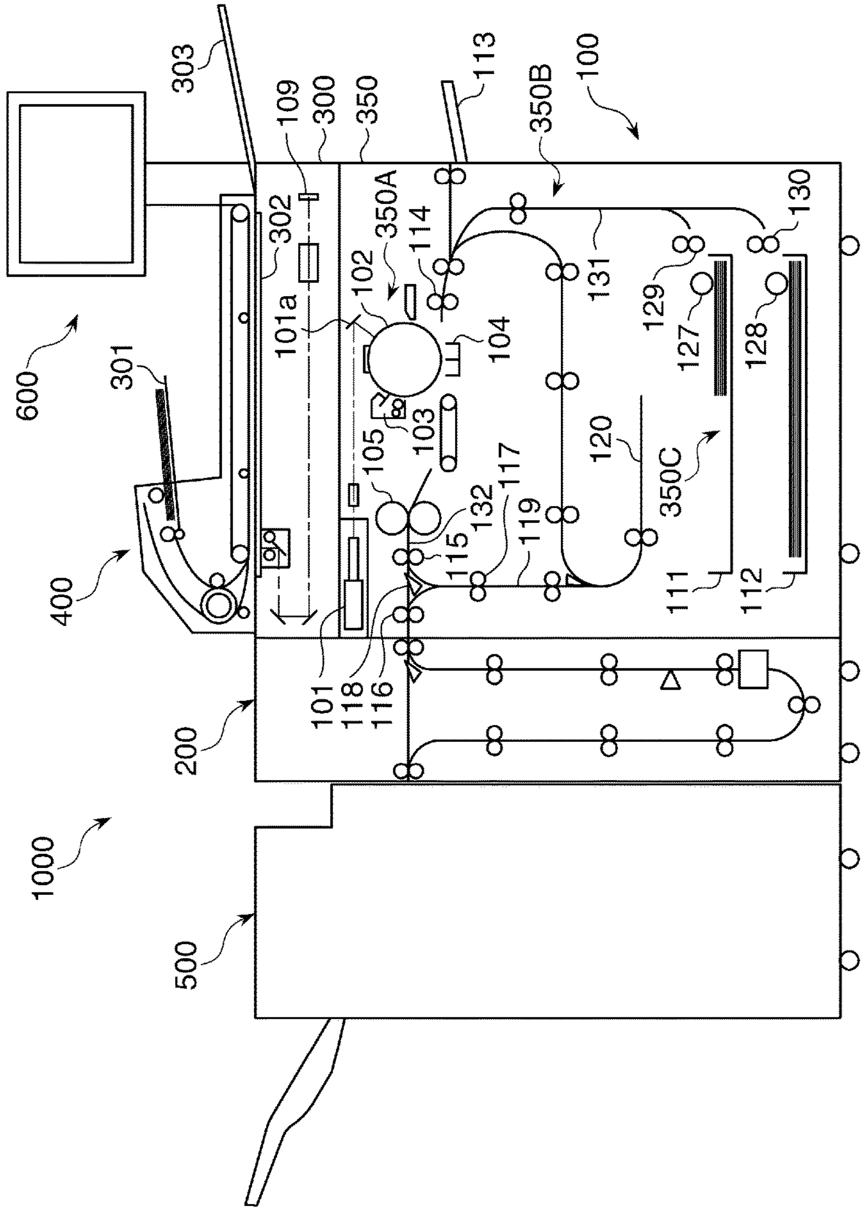
FIG. 1 is a schematic cross-sectional view of an image forming system according to an embodiment.

FIG. 1 is a schematic cross-sectional view of an image forming system according to the embodiment.

As shown in FIG. 1, the image forming system 1000 is basically comprised of an image forming apparatus 100, a punching device (puncher) 200, a sheet processing apparatus (finisher) 500, and a console unit 600.

The image forming apparatus 100 is comprised of an image reading device (image reader) 300 that reads an original, a document feeder 400 that feeds an original to the image reader 300, and a printer 350 that forms an image on a sheet based on image data.

The document feeder 400 is comprised of an original tray 301, a platen glass 302, and a discharge tray 303. The document feeder 400 feeds originals set on the original tray 301 e.g. with their front surfaces facing upward, one by one, from the leading page in a leftward direction as viewed in FIG. 1, such that the originals are guided along a curved path and conveyed from the left onto the platen glass 302 and then through a predetermined image reading position to the right. Then, each original is discharged onto the discharge tray 303.

The image reader 300 reads an original image by an image sensor 109 while the original is passing the predetermined image reading position on the platen glass 302 from the left to the right as viewed in FIG. 1. The original image read by the image sensor 109 is output as a video signal to an exposure device of the printer 350.

Next, a description will be given of the configuration of the printer 350.

The printer 350 is comprised of an image forming section 350A, a conveying path 350B along which a sheet P as a recording sheet is conveyed to the image forming section 350A, and a sheet storage section 350C for storing sheets P. The image forming section 350A is comprised of a photosensitive member 102 as an image bearing member, the exposure device 101 disposed in a manner opposed to the photosensitive member 102 and provided with a polygon mirror 101*a*, and a developing device 103. The sheet storage section 350C is comprised of an upper cassette 111, a lower cassette 112, and a manual sheet feeder 113.

The conveying path 350B includes a supply path 131 along which a sheet P is conveyed from the upper or lower cassette 111 or 112 to a transfer section 104 of the photosensitive member 102 and a discharge path 132 via which a sheet P having an image formed thereon and having passed through a fixing device 105 is discharged out of the image forming apparatus 100. An inversion path 119 is connected to the discharge path 132 at a location downstream of the fixing device 105, and a double-sided conveying path 120 is connected to the inversion path 119.

On the supply path 131, there are provided pickup rollers 127 and 128 and feed roller pairs 129 and 130 associated with the respective upper and lower cassettes 111 and 112, and a registration roller pair 114. On the discharge path 132, there are provided a conveying roller pair 115, a flapper 118 disposed at a branching point at which branches off the inversion path 119 located downstream of the fixing device 105, from the discharge path 132, and a discharge roller pair 116 for discharging a sheet P into the puncher 200 located downstream.

In the printer 350 configured as described above, the exposure device 101 modulates a laser beam based on a video signal input from the image reader 300 and causes the laser beam to scan the surface of the photosensitive member 102 using the polygon mirror 101*a* to thereby form an electrostatic latent image corresponding to the video signal on the photosensitive member 102. The developing device 103 supplies toner as a developer to the electrostatic latent image formed on the photosensitive member 102, whereby the electrostatic latent image is visualized as a toner image.

A sheet P fed from the upper cassette 111 or the lower cassette 112 is conveyed to the registration roller pair 114 at rest by the feed roller pair 129 or 130. When the sheet P reaches the registration roller pair 114, sheet information of the sheet P is notified from the image forming apparatus 100 to the puncher 200 as a downstream apparatus via a communication line. The sheet information contains the size, basis weight, and sheet material type of the sheet P to be discharged into the puncher 200, and the mode of post-processing to be performed on the sheet.

After the leading edge of the sheet P is brought into abutment with the registration roller pair 114 and stops, the registration roller pair 114 conveys the sheet P to the transfer section 104 of the photosensitive member 102 in timing synchronous with the start of laser beam irradiation. The toner image formed on the photosensitive member 102 is transferred onto the sheet P by the transfer section 104. The sheet P having the toner image transferred thereon is conveyed into the fixing device 105, and is heated and pressed by the fixing device 105, whereby the toner image is fixed onto the sheet P. The sheet P having passed through the fixing device 105 is discharged into the puncher 200 e.g. via the flapper 118 and the discharge roller pair 116.

When the sheet P is to be discharged face-down, i.e. with an image-formed surface thereof facing downward, the sheet P having passed through the fixing device 105 is once guided into the inversion path 119 by a switching operation of the flapper 118. Then, after the trailing edge of the sheet P has left the flapper 118, the sheet P is switched back and is discharged from the printer 350 by the discharge roller pair 116. This inversion sheet discharge is performed when image formation is performed sequentially from a top page, e.g. in the case of printing images read by using the document feeder 400 or printing images output from a computer. The order of discharged sheets is ascending page order.

A hard sheet P, such as an OHP sheet, is fed from the manual sheet feeder 113, and in the case of forming an image on the sheet P, the sheet P is not guided into the inversion path 119, but discharged with its image-formed surface up (face up) by the discharge roller pair 116.

On the other hand, in a case where double-sided printing for forming images on both sides of a sheet P is performed, the sheet P having an image formed on its first side is guided into the inversion path 119 by the switching operation of the flapper 118, and is then switched back and conveyed into the double-sided conveying path 120. Then, the sheet P is conveyed again from the double-sided conveying path 120 to the transfer section 104 of the photosensitive member 102 in predetermined timing, where an image is formed on the second side of the sheet P.

Next, a description will be given of the configuration of the puncher.

Figure 2:
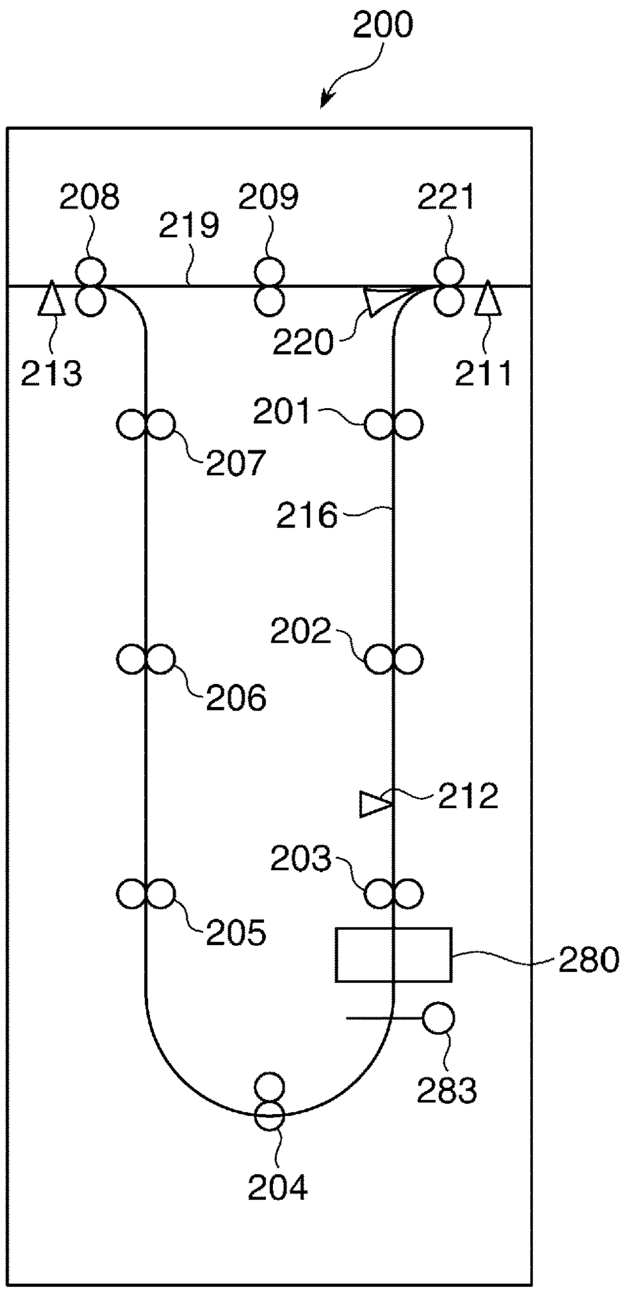
FIG. 2 is a schematic cross-sectional view of a puncher appearing in FIG. 1.

FIG. 2 is a schematic cross-sectional view of the puncher 200 appearing in FIG. 1.

As shown in FIG. 2, the puncher 200 is provided with a through path 219 for conveying a sheet P received from the printer 350 to a downstream apparatus, without performing punching on the same, and a U-shaped punching path 216 for performing punching on the same. On the through path 219, there are arranged conveying roller pairs 221, 209, and 208 along a sheet conveying direction in the mentioned order, and a conveyance sensor 211 is disposed upstream of the conveying roller pair 221. Further, a conveyance sensor 213 is disposed downstream of the conveying roller pair 208. The conveyance sensor 211 detects the sheet P discharged from the image forming apparatus 100 and conveyed into the puncher 200, and the conveyance sensor 213 detects the sheet P discharged from the puncher 200 to be conveyed into the finisher 500.

The punching path 216 has an inlet end thereof connected to a downstream side of the conveying roller pair 221, and an outlet end thereof connected to an upstream side of the conveying roller pair 208.

At a branching point where the punching path 216 branches off from the through path 219, there is provided a switching flapper 220. Further, on the punching path 216, there are arranged conveying roller pairs 201, 202, and 203, a punching unit 280, and conveying roller pairs 204, 205, 206, and 207, along a sheet conveying direction in the mentioned order. In the punching unit 280, there is set a punch die which is removable, and the punching unit 280 has a structure configured such that a desired one of a plurality of punch dies for forming punch holes of respective different shapes and respective different numbers can be selectively mounted thereon.

Further, at a location upstream of the punching unit 280, there is disposed a conveyance sensor 212, for detecting a sheet P being conveyed to the punching unit 280. At a location downstream of the punching unit 280, there is disposed an abutment member 283. In place of the abutment member 283, there may be used a roller pair. In this case, the roller pair nips and stops a sheep P, and then holes are punched in the sheet P in the stopped state.

The puncher 200 configured as described above sequentially takes in sheets P discharged from the image forming apparatus 100 and performs punching on the taken-in sheets P, as required, so as to punch holes in each of the sheets P. Whether or not to perform punching is determined based on sheet information sent from the image forming apparatus 100. The sheet information will be described hereinafter.

When punching is not to be performed on a sheet P discharged from the image forming apparatus 100, the sheet P is guided into the through path 219 via the conveying roller pair 221 and the flapper 220, and is conveyed to the finisher 500 as a downstream apparatus by the conveying roller pairs 209 and 208.

On the other hand, when punching is to be performed on a sheet P discharged from the image forming apparatus 100, the sheet P is guided into the punching path 216 via the conveying roller pair 221 and the flapper 220, and is conveyed into the punching unit 280 via the conveying roller pairs 201, 202, and 203. The punching unit 280 performs punching on the sheet P conveyed therein, using a predetermined punch die, whereby holes having a predetermined shape are punched in the sheet P at respective predetermined locations.

Figure 3:
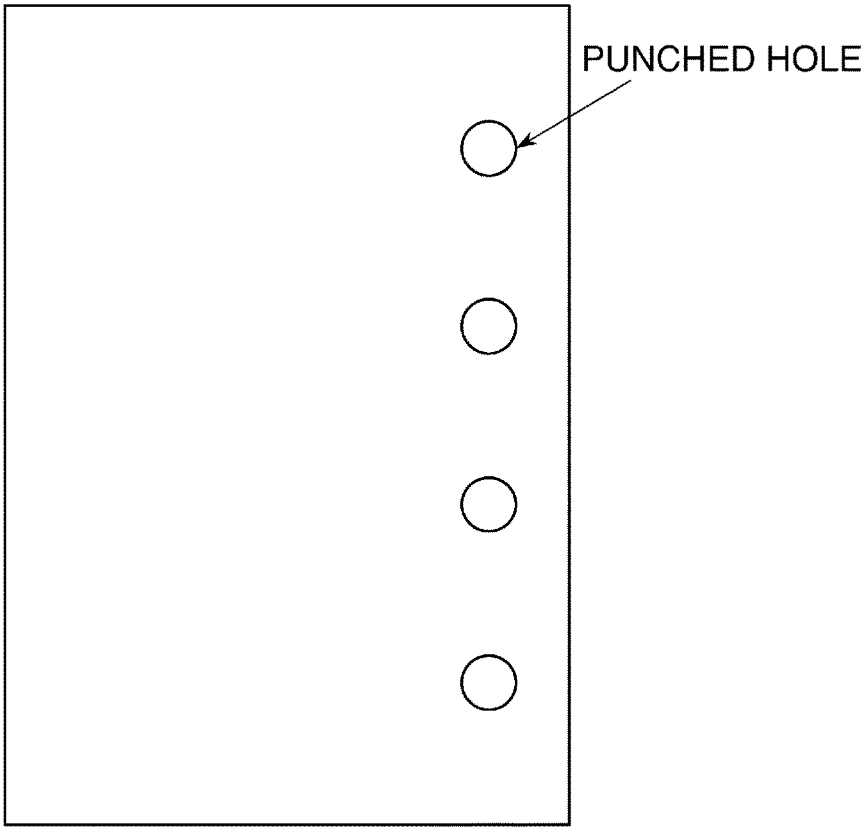
FIG. 3 is a view of a sheet having holes punched therein.

FIG. 3 is a view of a sheet having holes punched therein. In FIG. 3, the four punched holes are arranged along one side of the sheet P in symmetrical relation with respect to the center of the sheet length of the sheet P.

The sheet P having the holes punched therein is conveyed via the conveying roller pairs 204, 205, 206, 207, and 208 and discharged into the finisher 500 as a downstream apparatus.

Figure 4:
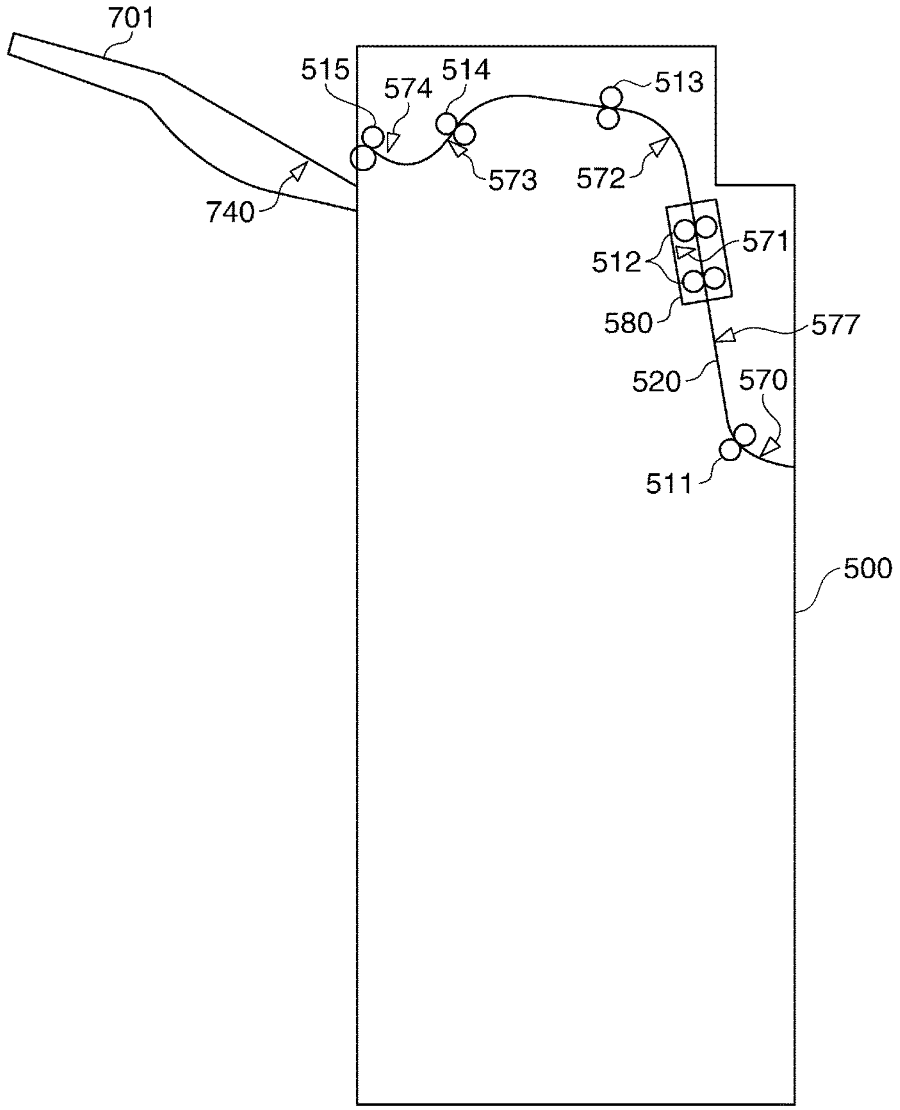
FIG. 4 is a schematic cross-sectional view of a finisher appearing in FIG. 1.

Next, a description will be given of the configuration of the finisher 500. FIG. 4 is a schematic cross-sectional view of the finisher 500 appearing in FIG. 1.

The finisher 500 has a conveying path 520 as a conveyance passage for conveying a sheet discharged from the puncher 200 to a stacking tray 701. On the conveying path 520, there are arranged a conveying roller pair 511, a shift unit 580, and conveying roller pairs 513, 514, and 515, along a sheet conveying direction in the mentioned order. The shift unit 580 is provided with conveying roller pairs 512 in respective inlet and outlet sides thereof. The shift unit 580 can be moved in a lateral direction orthogonal to the sheet conveying direction by being driven by a shift motor M4 referred to hereinafter.

A conveyance sensor 571 is disposed between the two conveying roller pairs 512. At a location upstream of the conveying roller pair 511, there is disposed a conveyance sensor 570. Further, at a location upstream of the shift unit 580, there is disposed a lateral displacement sensor 577. The lateral displacement sensor 577 detects the amount of displacement of a sheet P currently conveyed along the conveying path 520, in the lateral direction orthogonal to the sheet conveying direction. At a location downstream of the shift unit 580, there is disposed a conveyance sensor 572. Further, at a location downstream of the conveying roller pair 514, there is disposed a conveyance sensor 573, and at a location upstream of the conveying roller pair 515, there is disposed a conveyance sensor 574. Furthermore, the stacking tray 701 is provided with a tray sheet presence/absence sensor 740. The tray sheet presence/absence sensor 740 detects a sheet P discharged onto the stacking tray 701.

The finisher 500 configured as described above takes in a sheet P from the puncher 200 into the conveying path 520 by driving the conveying roller pair 511. The sheet P taken in by the conveying roller pair 511 is conveyed to the stacking tray 701. During this, the conveyance sensors 570, 571, 572, 573, and 574 detect passage of the sheet P.

When a sheet P is taken into the conveying path 520, the lateral displacement sensor 577 disposed upstream of the shift unit 580 detects the amount of displacement of the sheet P from the center position of conveyance on the conveying path 520 (hereinafter referred to as the lateral displacement amount). When the lateral displacement sensor 577 detects the lateral displacement amount of the sheet P, the shift unit 580 corrects the lateral displacement amount. In a case where offset sheet discharge is designated, the shift unit 580 further shifts the sheet P for offset by a shift amount designated for the offset sheet discharge. When the offset sheet discharge is not designated, the sheet P is conveyed toward the stacking tray 701 without being offset. Note that when passage of the sheet P through the shift unit 580 is detected by the conveyance sensor 571, the shift motor M4 is driven to return the shift unit 580 to its center position.

Thus, the sheets P shifted by the designated shift amount is discharged onto the stacking tray 701 via the conveying roller pairs 513, 514, and 515, and is stacked on the stacking tray 701. At this time, the tray sheet presence/absence sensor 740 detects the sheet P discharged onto the stacking tray 701.

Next, a description will be given of the configuration of the whole image forming system 1000 shown in FIG. 1, which is provided with a controller for controlling the overall operation of the same.

Figure 5:
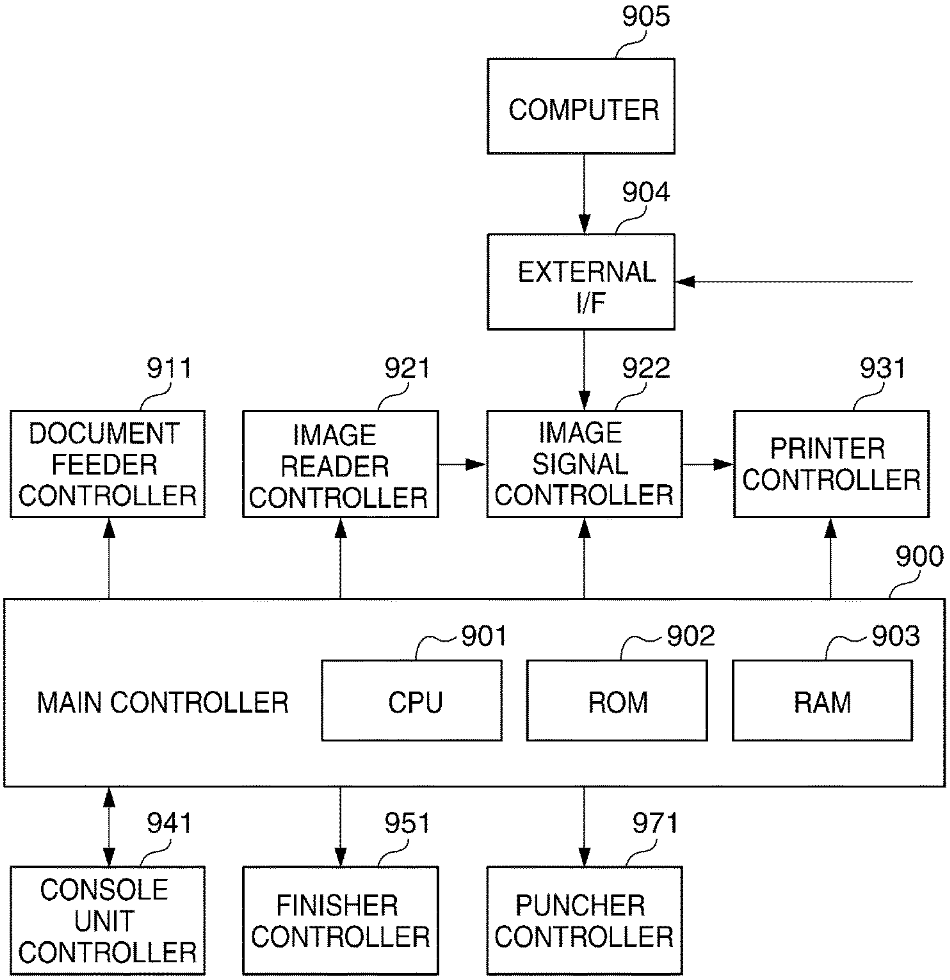
FIG. 5 is a control block diagram of the image forming system shown in FIG. 1.

FIG. 5 is a control block diagram of the image forming system 1000 shown in FIG. 1.

Referring to FIG. 5, the image forming system 1000 has a main controller 900 as the controller, and the main controller 900 includes a CPU 901 as a control unit, a ROM 902, and a RAM 903 as a second memory. The CPU 901 performs basic control of the whole image forming system 1000, and is connected by a data bus, not shown, to the ROM 902 having control programs written therein and the RAM 903 for performing processing.

The CPU 901 is connected to each of controllers 911, 921, 922, 904, 931, 941, 951, and 971, and performs centralized control of these according to control programs stored in the ROM 902. The controllers mentioned above are a document feeder controller 911, an image reader controller 921, an image signal controller 922, an external interface 904, a printer controller 931, a console unit controller 941, a finisher controller 951, and a puncher controller 971. The RAM 903 temporarily holds control data, and is also used as a work area for arithmetic operations involved in control processing.

The document feeder controller 911 controls the operation of the document feeder 400 based on instructions from the main controller 900. The image reader controller 921 controls driving of the image sensor 109, and transfers an image signal output from the image sensor 109 to the image signal controller 922.

The image signal controller 922 converts the image signal, which is an analog signal, from the image sensor 109 to a digital signal, and then converts the digital signal to a video signal by performing various processing on the digital signal, to output the video signal to the printer controller 931. Further, the image signal controller 922 performs various processing on a digital image signal input from a computer 905 via the external interface 904, and converts the digital image signal to a video signal, to output the video signal to the printer controller 931. The processing operations by the image signal controller 922 are controlled by the main controller 900. The printer controller 931 controls the printer 350 based on the input video signal to thereby perform image formation and sheet conveyance.

The console unit controller 941 exchanges information with the console unit 600 and the main controller 900. The console unit 600 has a plurality of keys for configuring various functions concerning image formation, as processing conditions, a display section, not shown, for displaying information indicating a state of configuration of each function, and so forth. The console unit 600 outputs a key signal corresponding to an operation of each key to the main controller 900. Further, based on a signal from the main controller 900, the console unit 600 causes the display section to display corresponding information.

The finisher controller 951 is mounted on the finisher 500, and controls driving of the whole finisher 500 by exchanging information with the main controller 900. The details of this control operation will be described hereinafter.

The puncher controller 971 is mounted on the puncher 200 and controls driving of the whole puncher 200 by exchanging information with the main controller 900. The details of this control operation will be described hereinafter.

Figure 6:
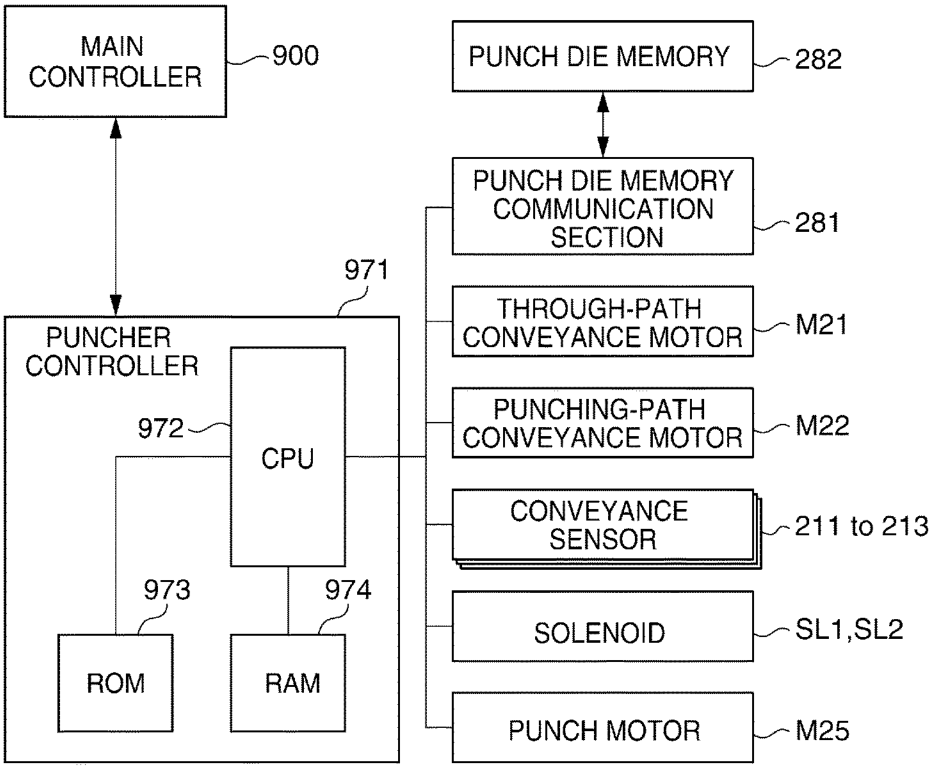
FIG. 6 is a block diagram of a puncher controller appearing in FIG. 5.

Next, a description will be given of the control configuration of the puncher 200. FIG. 6 is a block diagram of the puncher controller 971 appearing in FIG. 5.

Referring to FIG. 6, the puncher controller 971 includes a CPU 972 as a punching control unit, a ROM 973, and a RAM 974. The puncher controller 971 communicates, via the communication IC, with the main controller 900 of the image forming apparatus 100, to exchange data including job information and a sheet receipt/delivery notification.

The CPU 972 of the puncher controller 971 is connected to each of a punch die memory communication section 281, a through-path conveyance motor M21, a punching-path conveyance motor M22, the conveyance sensors 211 to 213, solenoids SL1 and SL2, and a punch motor M25. The CPU 972 executes various programs stored in the ROM 973 according to instructions from the main controller 900, to thereby control the driving of the puncher 200.

Further, the CPU 972 communicates, via the punch die memory communication section 281, with a punch die memory 282 mounted as a first memory in a punch die set in the punching unit 280. When information stored in the punch die memory 282 is read and written properly, the CPU 972 recognizes that the punch die has been set.

The through-path conveyance motor M21 drives the conveying roller pairs 208, 209, and 221 for sheet conveyance. The punching-path conveyance motor M22 drives the conveying roller pairs 201 to 207. The solenoid SL1 drives the switching flapper 220 for switching between the through path 219 and the punching path 216. The solenoid SL2 drives the abutment member 283. The punch motor M25 drives the punching unit 280 to punch holes in a sheet P conveyed therein. The conveyance sensors 211 to 213 each detect a sheet P being conveyed.

Figure 7:
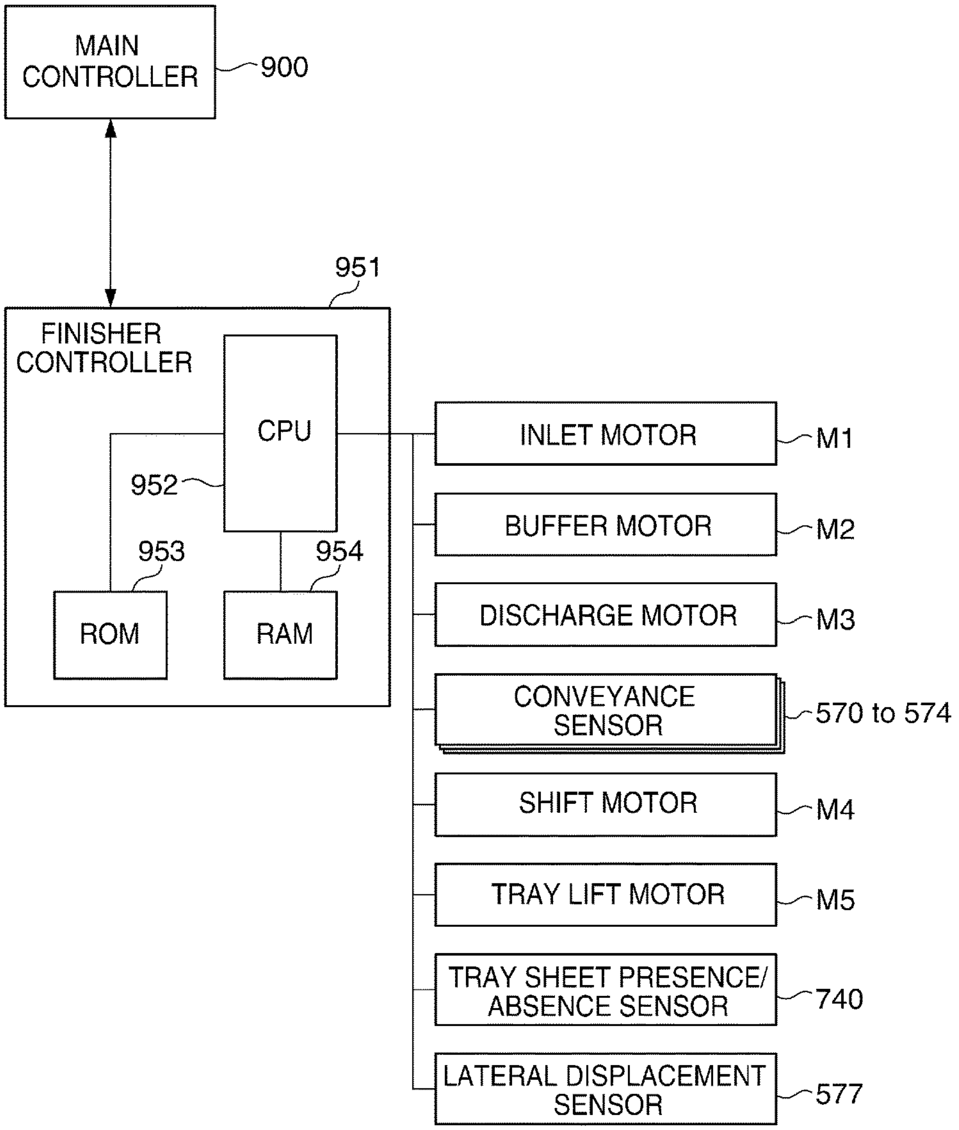
FIG. 7 is a block diagram of a finisher controller appearing in FIG. 5.

Next, a description will be given of the control configuration of the finisher 500. FIG. 7 is a block diagram of the finisher controller 951 appearing in FIG. 5.

Referring to FIG. 7, the finisher controller 951 includes a CPU 952, a ROM 953, and a RAM 954. The finisher controller 951 communicates, via the communication IC, with the main controller 900 provided in the image forming apparatus 100, to exchange data including job information and a sheet receipt/delivery notification The CPU 952 of the finisher controller 951 is connected to each of an inlet motor M1, a buffer motor M2, a discharge motor M3, the conveyance sensors 570 to 574, the shift motor M4, a tray lift motor M5, the tray sheet presence/absence sensor 740, and the lateral displacement sensor 577. The CPU 952 executes various programs stored in the ROM 953 according to instructions from the main controller 900, to thereby control the driving of the finisher 500.

The inlet motor M1, the buffer motor M2, and the discharge motor M3 drive the conveying roller pairs 511 to 515 so as to convey a sheet P. The conveyance sensors 570 to 574 detect the sheet P being conveyed. The lateral displacement sensor 577 detects a lateral edge position of the conveyed sheet P. The shift motor M4 moves the shift unit 580 in a direction orthogonal to the sheet conveying direction. The tray lift motor M5 lifts up and down the stacking tray 701. The tray sheet presence/absence sensor 740 detects a sheet P discharged onto the stacking tray 701.

Next, a description will be given of a punching process performed in the image forming system shown in FIG. 1. The punching process is performed so as to form predetermined punched holes in each sheet P discharged from the image forming apparatus 100 of the image forming system 1000.

Figure 8:
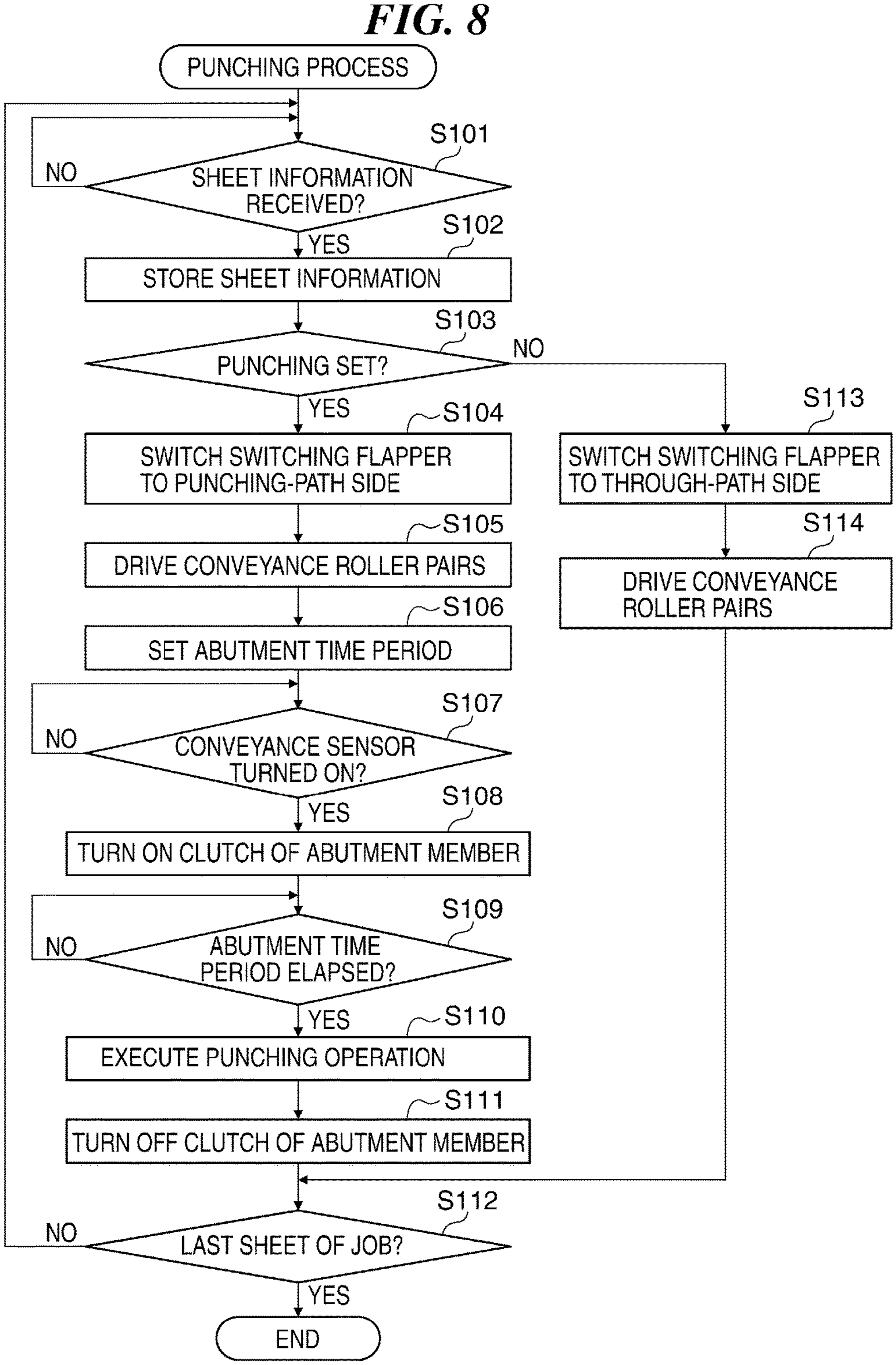
FIG. 8 is a flowchart of a punching process performed in the image forming system shown in FIG. 1.

FIG. 8 is a flowchart of the punching process performed in the image forming system shown in FIG. 1. The punching process is performed by the CPU 972 of the puncher controller 971 of the puncher 200 according to a punching process program stored in the ROM 973.

Referring to FIG. 8, when the punching process is started, first, the CPU 972 determines whether or not sheet information of a sheet P to be processed has been received from the image forming apparatus 100 as the upstream apparatus, and waits until the sheet information is received (step S101). After receipt of the sheet information, the CPU 972 stores the received sheet information in the RAM 974 (step S102) and then sends the sheet information to the finisher 500 as the downstream apparatus.

Then, the CPU 972 determines whether or not punching has been set for the sheet P (step S103). In doing this, the CPU 972 determines as to whether or not punching has been set, based on the sheet information received in the step S101.

In the following, a description will be given of how a user sets punching for a sheet P. Details of punching are set by the user via the console unit 600 as a user interface before image formation is started by the image forming apparatus 100.

Figure 9:
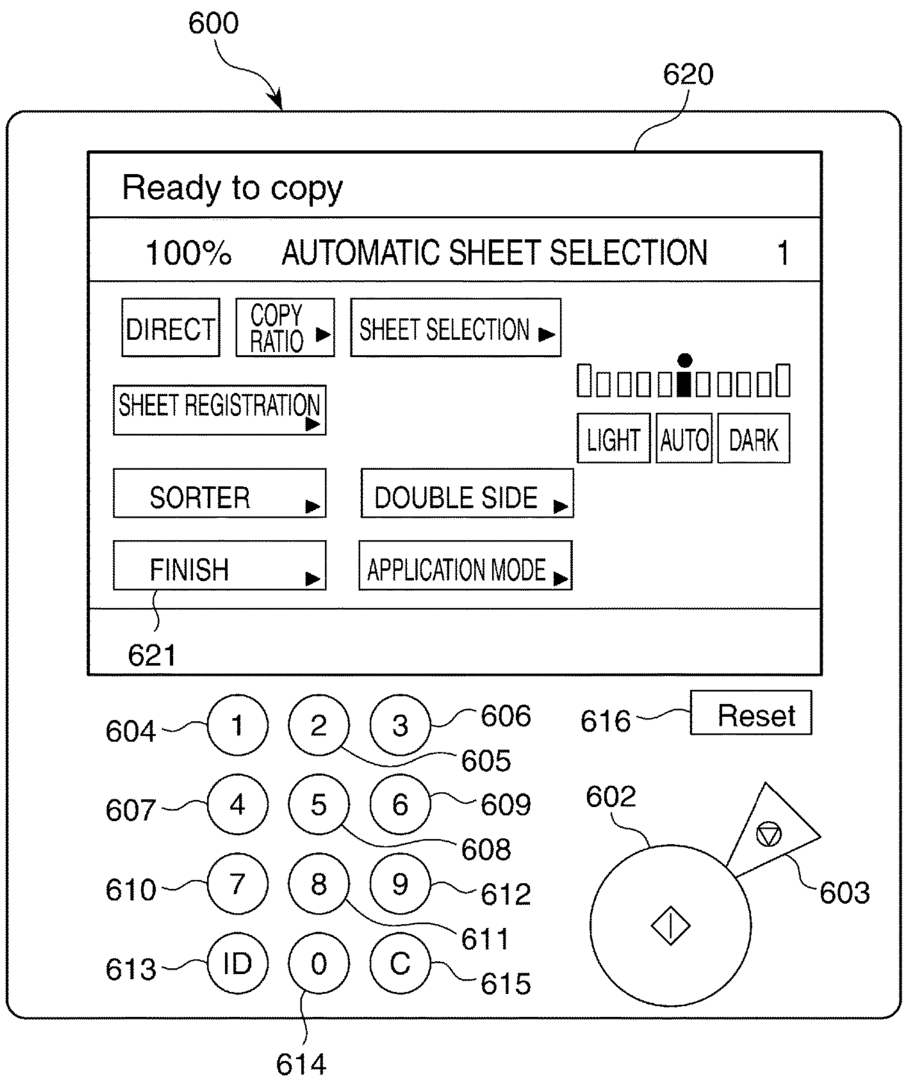
FIG. 9 is a view of a console unit.

FIG. 9 is a view of the console unit 600.

As shown in FIG. 9, the console unit 600 is provided with a start key 602 for starting an image forming operation, a stop key 603 for stopping the image forming operation, and ten keys 604 to 612 and 614 for entering numbers. Further, on the console unit 600, there are arranged an ID key 613, a clear key 615, a reset key 616, and a user mode key, not shown, for configuring settings for various devices. Further, the console unit 600 is provided with a display section 620 implemented by a touch panel, and on a display screen of the display section 620, there are displayed various soft keys.

In the image forming system 1000, post-processing modes, such as a non-sorting mode, a sorting mode, a stapling sorting mode (binding mode), and a punching mode are performed. Each processing mode is set according to user's input operation performed on the console unit 600.

Figure 10:
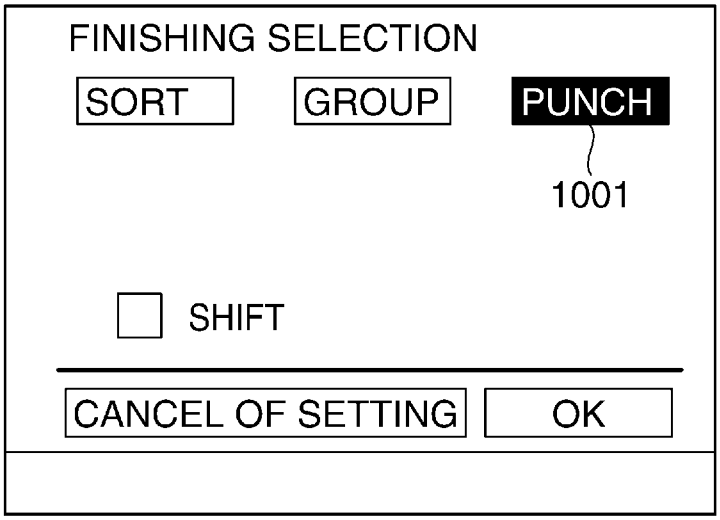
FIG. 10 is a view of a finishing selection screen.

When the user presses a finishing key 621 on the display section 620 in FIG. 9 so as to set punching, the CPU 901 determines that the finishing key 621 has been pressed based on information output from the console unit controller 941, and shifts the display section 620 to a finishing selection screen. FIG. 10 is a view of the finishing selection screen. When the user presses a "punch" key 1001 in the finishing selection screen in FIG. 10 and then presses an "OK" key, the post-processing mode is set to the punching mode whereby punching is set, whereafter the display section 620 returns to its initial screen (i.e. the FIG. 9 screen of the display section 620). Note that when a key other than the "punch" key 1001 is pressed in the finishing selection screen, a finishing corresponding to the selected key is set.

Then, when a job is started, sheet information of a sheet P is sent from the CPU 901 to the CPU 972 of the puncher 200. FIGS. 11A and 11B each illustrate sheet information of a sheet P to be discharged from the image forming apparatus 100 into the puncher 200.

FIG. 11A illustrates sheet information output when the punching has been set, while FIG. 11B illustrates sheet information output when punching has not been set.

The sheet information shown in FIG. 11A contains not only information concerning a sheet ID, a sheet width, a sheet length, a basis weight, a sheet type, and a last-sheet flag, but also information indicating that punching has been set. Note that in the sheet information shown in FIG. 11B, it is indicated that punching has not been set.

Figure 12A:
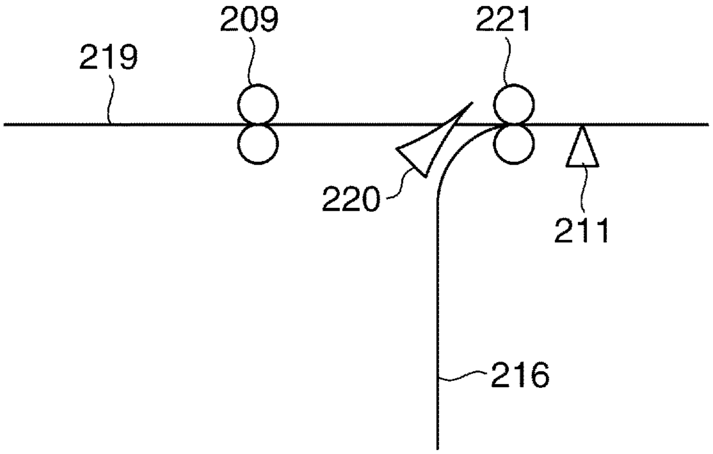
FIGS. 12A and 12B are views useful in explaining the operation of a switching flapper.
Figure 12B:
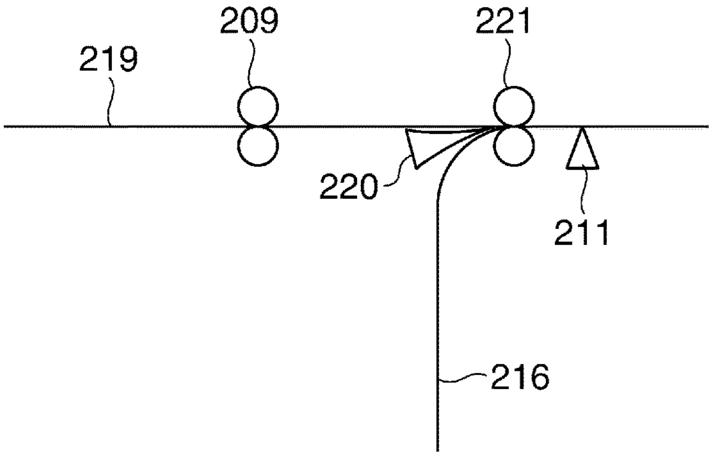

Referring again to FIG. 8, if it is determined in the step S103 that punching has been set (YES to the step S103), the CPU 972 turns on the solenoid SL1 to switch the switching flapper 220 such that the sheet P is guided into the punching path 216 (step S104). FIGS. 12A and 12B are views useful in explaining the operation of the switching flapper 220. In FIG. 12A, the switching flapper 220 has been switched such that the sheet P conveyed into the puncher 200 is guided into the punching path 216.

After having switched the conveyance destination of the sheet P to the punching path 216 (step S104), the CPU 972 proceeds to a step S105. In the step S105, the CPU 972 controls the punching-path conveyance motor M22 to cause rotation of the conveyance roller pairs 201 to 207 whereby the sheet P is conveyed in the punching path 216.

Then, the CPU 972 sets an abutment time period of the abutment member 283 disposed downstream of the punching unit 280 e.g. to 100 msec (step S106). The abutment time period is a time period over which the sheet P is in stoppage in a state held in abutment with the abutment member 283, i.e. a time period over which the clutch-on state of the abutment member 283 is held. In other words, the abutment time period corresponds to a stop time period of the sheet P, which is required for a punching operation.

Figure 13A:
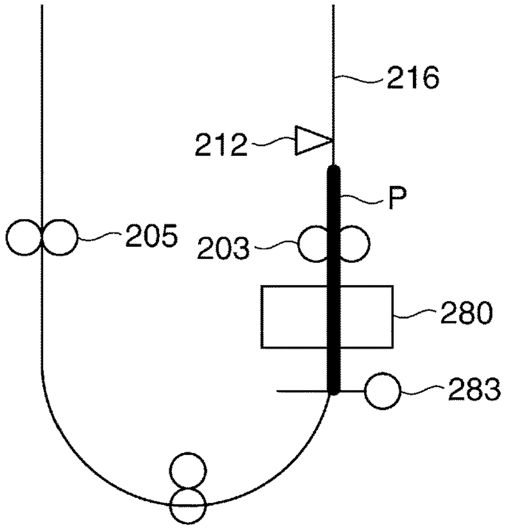
FIGS. 13A and 13B are views useful in explaining the operation of an abutment member.
Figure 13B:
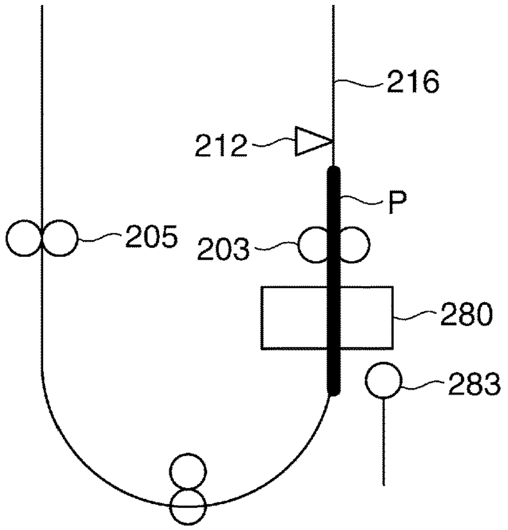

FIGS. 13A and 13B are views useful in explaining the operation of the abutment member 283. During a time period over which the clutch, not shown, of the abutment member 283 is held on, the abutment member 283 is in a state projecting into the punching path 216, as shown in FIG. 13A. Therefore, the sheet P comes into abutment with the abutment member 283 and is held in stoppage. On the other hand, during a time period over which the clutch is held off, the abutment member 283 is held retracted from the punching path 216, as shown in FIG. 13B. Therefore, the sheet P is conveyed downstream.

Referring again to FIG. 8, after having set the abutment time period (step S106), the CPU 972 determines whether or not the conveyance sensor 212 has detected the sheet P (i.e. the conveyance sensor 212 has been turned on), and waits until the conveyance sensor 212 detects the sheet P (step S107). If it is determined in the step S107 that the conveyance sensor 212 has detected the sheet P (YES to the step S107), the CPU 972 turns on the clutch of the abutment member 283 by controlling the solenoid SL2, to thereby stop the sheet P (step S108).

Then, the CPU 972 waits until 100 msec as the clutch-on time (abutment time period) elapses after detection of the sheet P by the conveyance sensor 212 (step S109). When 100 msec elapses after detection of the sheet P by the conveyance sensor 212, the CPU 972 performs a punching operation by controlling the punch motor M25 (step S110). After having performed the punching operation, the CPU 972 stops driving of the solenoid SL2 to turn off the clutch of the abutment member 283 (step S111). This causes the conveyance of the sheet P to the finisher 500 as the downstream apparatus to be resumed.

Then, the CPU 972 determines whether or not the sheet P is the last sheet of the job (step S112). At this time, the CPU 972 performs this determination based on the sheet information of the sheet P, which was received from the image forming apparatus 100. If it is determined in the step S112 that the sheet P is the last sheet (YES to the step S112), the CPU 972 terminates the present process.

On the other hand, if it is determined in the step S112 that the sheet P is not the last sheet (NO to the step S112), the CPU 972 returns to the step S101 and repeatedly performs the punching process described above on the following sheet.

If it is determined in the step S103 that punching has not been set for the sheet P (NO to the step S103), the CPU 972 switches the switching flapper 220, as shown in FIG. 12B, such that the sheet P is guided into the through path 219 (step S113). In FIG. 12B, the switching flapper 220 has been switched such that the sheet P conveyed into the puncher 200 is guided into the through path 219. Then, the CPU 972 drives the through-path conveyance motor M21 to cause rotation of the conveyance roller pairs 208 and 209 so as to convey the sheet P directly to the finisher 500 as the downstream apparatus (step S114). Thereafter, the CPU 972 proceeds to the step S112.

According to the FIG. 8 process, when the punching has been set in sheet information received from the image forming apparatus 100 as the upstream apparatus (YES to the step S103), the switching flapper 220 is switched such that the sheet P associated therewith is guided into the punching path 216 (step S104). Then, the sheet P is brought into abutment with the abutment member 283 and stopped, whereafter a predetermined punching operation is performed by the punching unit 280 (step S110). Thus, it is possible to form predetermined punched holes in the sheet P at respective locations matching the sheet information.

Next, a description will be given of a lubrication management process for data management involved in punching performed by the image forming system 1000 shown in FIG. 1.

The lubrication management process is performed by the CPU 901 of the main controller 900 of the image forming system 1000 according to a lubrication management process program stored in the ROM 902.

Figure 14:
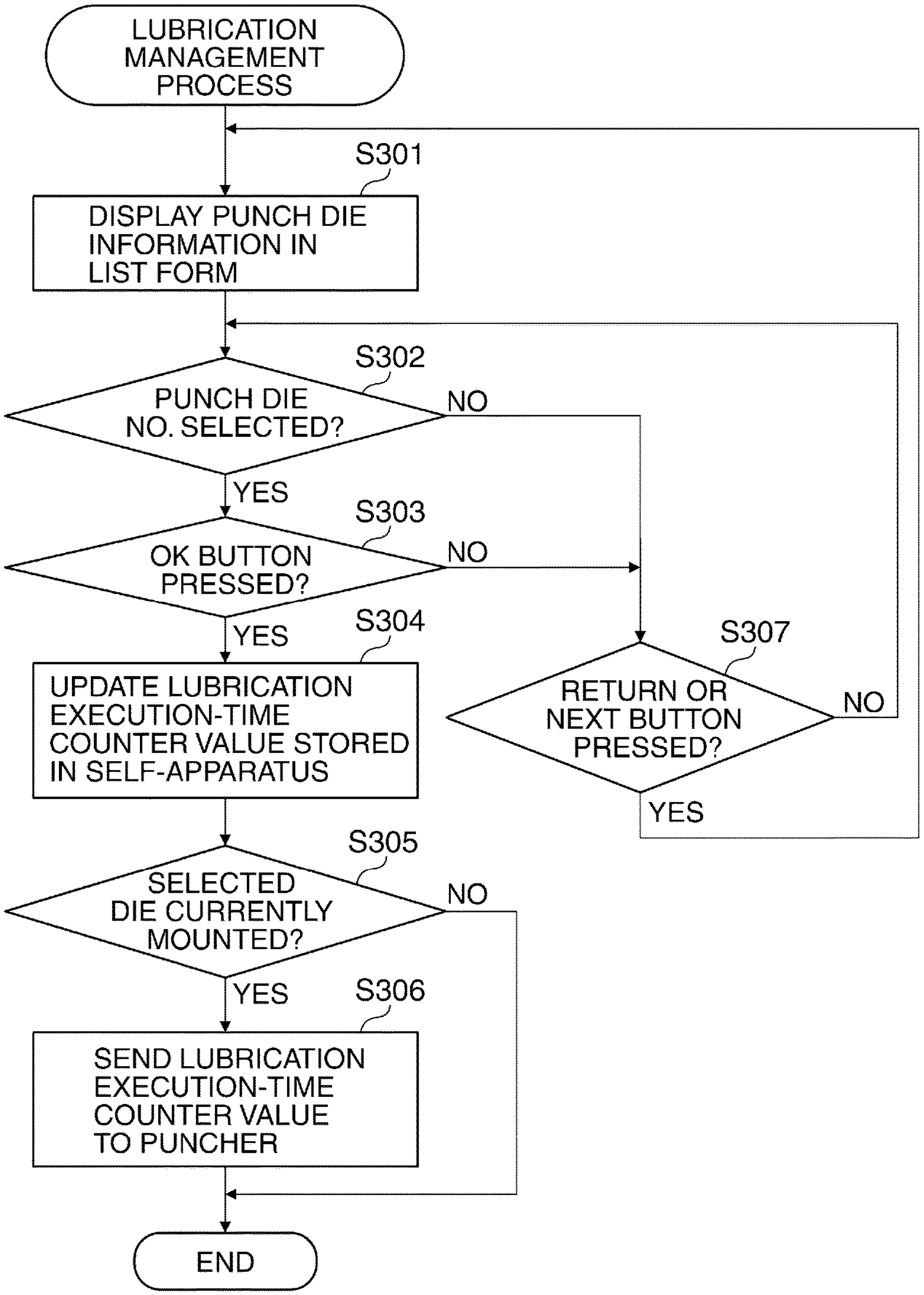
FIG. 14 is a flowchart of a lubrication management process performed in the image forming system shown in FIG. 1.

FIG. 14 is a flowchart of the lubrication management process performed in the image forming system 1000. The lubrication management process is started when the user inputs an instruction for lubrication from the console unit 600.

Referring to FIG. 14, when the lubrication management process is started, first, the CPU 901 displays punch die information in the form of a list on the display section 620 of the console unit 600 (step S301).

Figure 15A:
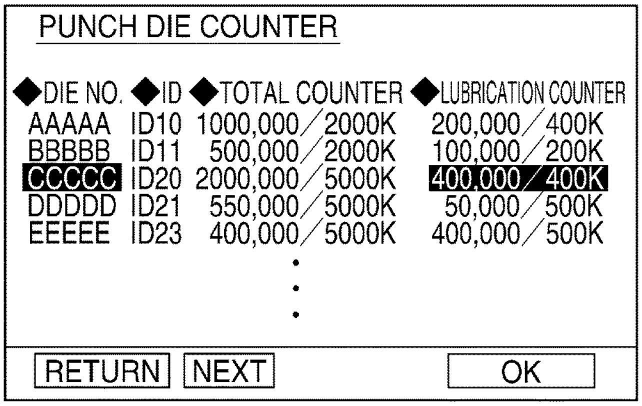
FIGS. 15A to 15C are views of punch die information displayed in the form of a list.
Figure 15B:
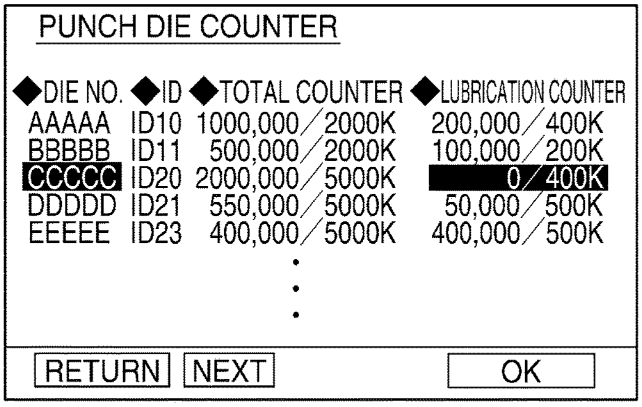
Figure 15C:
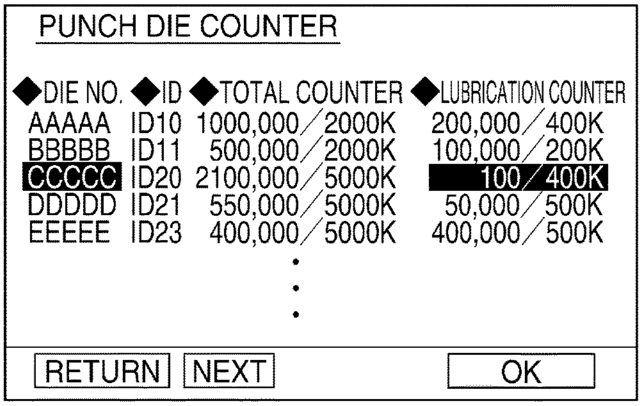

FIGS. 15A to 15C are views of the punch die information displayed in the list form. In FIG. 15A, there are displayed pieces of punch die information each formed by the information items of a die number as a management number, an ID, a total counter, and a lubrication counter of an associated one of punch dies ever mounted on the puncher 200. Each set of information items are displayed based on punch die information stored in a punch die memory 282, referred to hereinafter, which is notified in a predetermined format from the puncher 200 and is stored in the RAM 903, when a punch die associated therewith is mounted on the puncher 200 or when the image forming system 1000 is powered on. The lubrication counter information serves as maintenance information as well.

The pieces of the punch die information are each stored in the punch die memory 282 mounted on an associated one of the punch dies mounted or to be mounted on the puncher 200, on a punch die-by-punch die basis. Further, the punch die information of each punch die is stored in the RAM 903 of the main controller 900 as well, in association with the management number of the punch die.

FIGS. 16A to 16I are views illustrating the format of punch die information stored in the punch die memory and examples of the punch die information in the format.

As shown in FIG. 16A, the format of the punch die information stored in the punch die memory has items of a die number as identification information, a die ID, a total counter, and a lubrication execution-time counter. Referring to FIG. 15A, the die number is information uniquely assigned to each punch die. The die ID is information indicative of a punch hole type (e.g. the number and shape of punch holes) formed by an associated punch die. Unless there are used a plurality of punch dies of the same type, each punch die can also be identified by the die ID. The total counter indicates the relationship between a total number of times of punching operation performed using the punch die and a number of times of punching operation corresponding to the service life of the punch die e.g. as 2000,000/5000K. Further, the lubrication counter indicates the relationship between a number of times of punching operation performed after execution of lubrication and a number of times of punching operation corresponding to a lubrication interval e.g. as 400,000/400K. Note that "K" in FIGS. 15A to 15C is a unit symbol representing 1000 (times).

Referring again to FIG. 14, after having displayed the punch die information in the list form, the CPU 901 determines whether or not the die number of a punch die as a target for information update has been selected by the user (step S302). If it is determined in the step S302 that the die number of the punch die has been selected (YES to the step S302), the CPU 901 displays the selected die number and a lubrication counter value associated therewith in reverse video on the list. In FIG. 15A, the die number of the punch die selected by the user and the lubrication counter value associated therewith are displayed in reverse video.

Then, the CPU 901 determines whether or not an OK button has been pressed by the user (step S303). If it is determined in the step S303 that the OK button has been pressed by the user (YES to the step S303), the CPU 901 updates a lubrication execution-time counter value stored in the RAM 903 of the self-apparatus (image forming system) (step S304).

More specifically, as shown in FIG. 16C, the total counter value of the system-side data (punch die information stored in the RAM 903) corresponding to the data of FIG. 16B is copied to the lubrication execution-time counter value of the same system-side data (punch die information), whereby the lubrication execution-time counter value is updated. At this time, the lubrication counter value displayed on the display section 620 of the console unit 600 is changed to "0/400K" as shown in FIG. 15B. The reason why the lubrication counter value on the display section 620 is displayed as "0/400K" though the lubrication execution-time counter value stored in the RAM 903 as the system-side storage section (and the punch die memory 282 in the case where the associated punch die is currently mounted, as described hereinafter) is updated to the total counter value is that while each punch die is managed based on the cumulative number of times of punching operation, it is required to display how many punching operations are allowed before a next lubrication time, such that the user can easily understand.

Then, the CPU 901 determines whether or not the currently mounted punch die is the punch die lubricated this time, i.e. whether or not the selected die number is identical to that of the currently mounted punch die (step S305). If it is determined in the step S305 that the currently mounted punch die is identical to the selected die number (YES to the step S305), the CPU 901 proceeds to a step S306, wherein the CPU 901 sends the punch die information containing the lubrication execution-time counter value to be updated, to the CPU 972 of the puncher 200, followed by terminating the present process.

At this time, the CPU 972 as a control unit of the puncher 200 having received the punch die information containing the lubrication execution-time counter value communicates with the punch die memory 282 to thereby update the punch die information in the punch die memory 282 with the punch die information received from the CPU 901.

In the following, a description will be given of a punch die memory communication process performed in the puncher 200 so as to update the punch die information through communication with the punch die memory 282. The punch die memory communication process is performed by the CPU 972 of the puncher controller 971 of the puncher 200 according to a punch die memory communication process program stored in the ROM 973.

Figure 17:
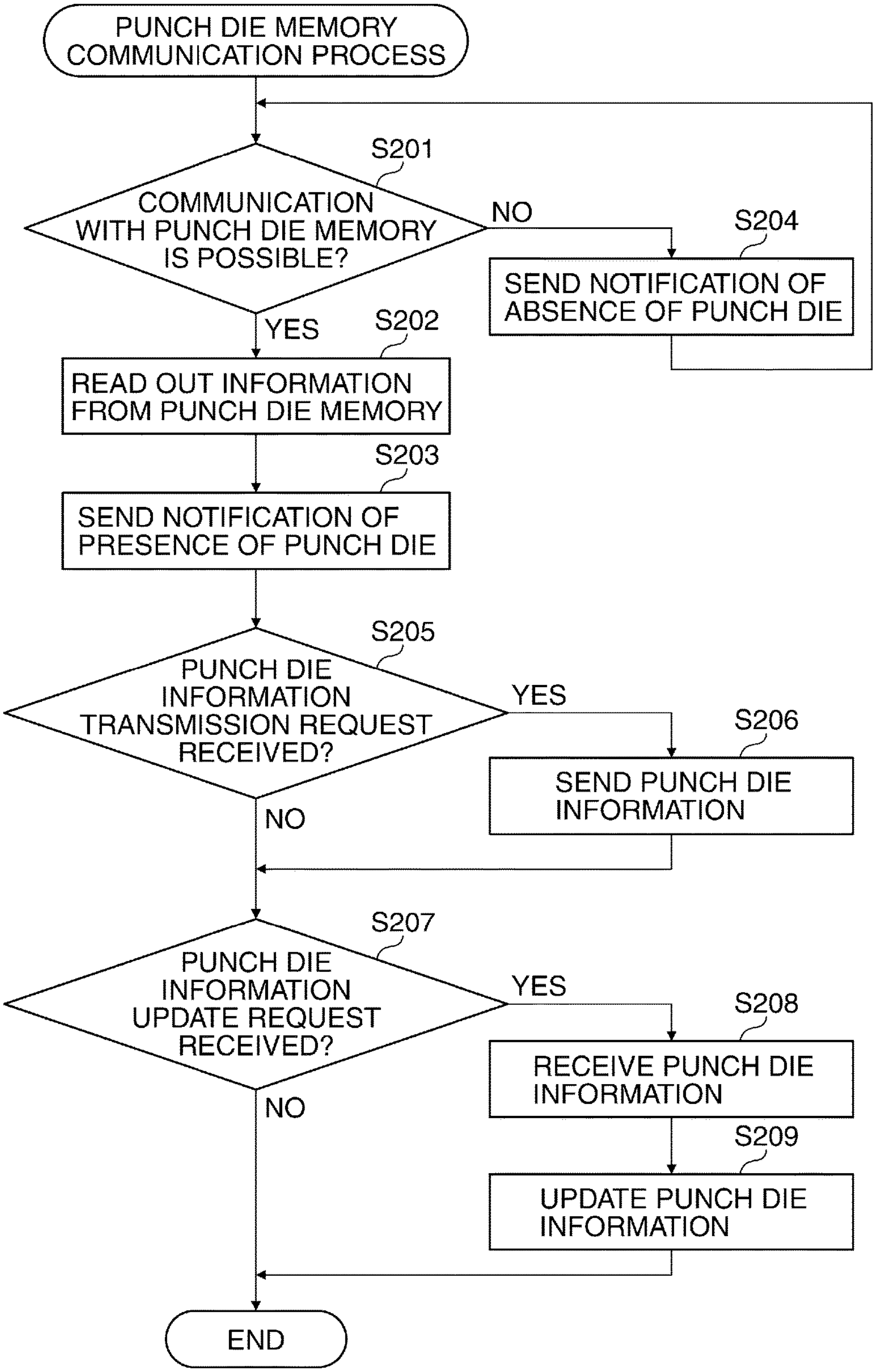
FIG. 17 is a flowchart of a punch die memory communication process performed in the puncher.

FIG. 17 is a flowchart of the punch die memory communication process performed in the puncher 200.

Referring to FIG. 17, when the punch die memory communication process is started, first, the CPU 972 determines whether or not communication with the punch die memory 282 provided in the punch die is possible (step S201). If it is determined in the step S201 that the communication is possible (YES to the step S201), the CPU 972 reads out the punch die information from the punch die memory 282 (step S202). In the punch die memory 282, there is stored the data of the punch die information shown in FIG. 16B, referred to hereinbefore, for example. In the example of FIG. 16B, there is stored a die ID of ID 20, a die number of CCCCC, a total counter of 2000,000, and a lubrication counter of 1600,000.

Then, the CPU 972 of the puncher controller 971 notifies the CPU 901 of the image forming system 1000 that a punch die is currently mounted on the puncher 200 (step S203). After having notified the CPU 901 that a punch die is currently mounted, the CPU 972 determines whether or not a punch die information transmission request has been received from the CPU 901 (step S205). At this time, in a case where it is necessary for the CPU 901 to update the punch die information in the system-side RAM 903 to the punch die information in the punch die memory 282, the CPU 901 issues the punch die information transmission request to the CPU 972. The reason why the CPU 901 issues the punch die information transmission request is that it is required to make the two pieces of the punch die information stored in the RAM 903 and the punch die memory 282, respectively, identical to each other.

If it is determined in the step S205 that the transmission request has not been received (NO to the step S205), the CPU 972 further determines whether or not a punch die information update request has been received from the CPU 901 (step S207). At this time, in a case where it is necessary for the CPU 901 to cause the punch die information in the punch die memory 282 to be updated to the punch die information in the system-side RAM 903, the CPU 901 issues the information update request to the CPU 972. This causes the two pieces of the punch die information stored in the RAM 903 and the punch die memory 282, respectively, to be identical to each other.

On the other hand, if it is determined in the step S205 that the punch die information transmission request has been received (YES to the step S205), the CPU 972 proceeds to a step S206, wherein the CPU 972 sends the punch die information read out from the punch die memory 282 in the step S202 to the CPU 901, and then proceeds to the step S207.

If it is determined in the step S207 that the punch die information update request has been received (YES to the step S207), the CPU 972 proceeds to a step S208, wherein the CPU 972 receives from the CPU 901 the punch die information with which an update is to be performed, and updates the punch die information in the punch die memory 282 with the received punch die information (step S209), followed by terminating the present process.

At this time, the punch die information stored in the punch die memory 282 is updated, for example, from the punch die information show in FIG. 16B, using the punch die information stored in the RAM 903 shown in FIG. 16C, into punch die information shown in FIG. 16D. At this time, as shown in FIG. 16E, the punch die information stored in the RAM 903 remains the same as the punch die information shown in FIG. 16C, without being updated. This punch die information update corresponds to a case where punch die information, stored in the RAM 903, of a lubricated punch die is updated in a state where the punch die is not mounted on the present system and thereafter the punch die is mounted on the puncher 200.

On the other hand, if it is determined in the step S207 that the punch die information update request has not been received (NO to the step S207), the CPU 972 immediately terminates the present process.

If it is determined in the step S201 that communication with the punch die memory 282 is not possible (NO to the step S201), the CPU 972 proceeds to a step S204, wherein the CPU 972 determines that there is no punch die currently mounted, and notifies the main controller 900 of the fact, followed by returning to the step S201.

According to the punch die memory communication process shown in FIG. 17, it is determined whether or not a punch die is currently mounted (step S201), and when a punch die is currently mounted, information is read out from the punch die memory 282 of the currently mounted punch die (step S202). Then, in response to a request from the CPU 901, the punch die information in the punch die memory 282 is updated with the punch die information in the RAM 903 of the main controller 900 (step S209). This cause the punch die information in the punch die memory 282 of the punch die mounted on the puncher 200 and the corresponding punch die information stored in the main controller 900 to identical to each other.

Referring again to FIG. 14, if it is determined in the step S305 that the currently mounted punch die does not match the selected die number or no punch die is currently mounted (NO to the step S305), the CPU 901 immediately terminates the present process. In this case, the punch die information stored in the punch die memory remains the same as the punch die information shown e.g. in FIG. 16B, without being updated.

If it is determined in the step S302 that no die number has been selected (NO to the step S302), the CPU 901 proceeds to a step S307. Similarly, if it is determined in the step S303 that the OK button has not been pressed (NO to the step S303), the CPU 901 proceeds to the step S307, wherein the CPU 901 determines whether or not a “return” button or a “next” button has been pressed. If it is determined in the step S307 that neither of the “return” button and the “next” button has been pressed (NO to the step S307), the CPU 901 returns to the step S302. On the other hand, if either the “return” button or the “next” button has been pressed (YES to the step S307), the CPU 901 returns to the step S301, wherein a list screen of the preceding or following page is displayed.

According to the lubrication management process shown in FIG. 14, when a user selects a lubricated punch die on a list and presses the OK button (step S303), the CPU 901 updates a lubrication execution-time counter value stored in the RAM 903 in association with the punch die selected by the user (step S304). Thereafter, on condition that the selected die number and the currently mounted punch die match each other, the CPU 901 sends the updated lubrication execution-time counter value to the puncher 200 (step S306). Then, the CPU 972 of the puncher 200 updates the lubrication execution-time counter value of the punch die information of the corresponding punch die to the updated lubrication execution-time counter value (step S209 in FIG. 17).

This makes it possible for the user to perform an operation for updating punch die information, for a punch die subjected to lubrication, and update punch die information stored in the punch die memory 282 and punch die information stored in the system-side RAM 903 to thereby properly manage the punch die information in each of the punch die memory 282 and the RAM 903. Further, by performing management of punch die information as described above, the lubrication counter associated with a punch die subjected to lubrication is updated (reset to 0), and when it becomes a next time to subject the punch die to lubrication, a value of the lubrication counter indicating a lubrication execution time is displayed on the display section 620 of the console unit 600, thereby making it possible to call the attention of the user to execution of lubrication.

In the present embodiment, in a case where lubrication is executed every predetermined number of times of use of a punch die, the lubrication execution-time counter value as management information is rewritten with the total counter value, whereafter the lubrication execution-time counter value rewritten at the time of the lubrication is held without being updated until lubrication is performed next time. On the other hand, the lubrication counter value as information displayed on the display section 620 of the console unit 600 is updated to "0" (e.g. as "0/400K") when lubrication is executed. Thereafter, the displayed lubrication counter value is incremented whenever a punching operation is performed, and when it reaches "400,000/400K", an indication prompting execution of lubrication, for example, is displayed on the display section 620.

Next, a description will be given of an exchange management process performed in the image forming system 1000.

The exchange management process is performed for data management when one punch die is exchanged with another. This process is performed by the CPU 901 of the main controller 900 of the image forming system 1000 according to an exchange management process program stored in the ROM 902.

Figure 18:
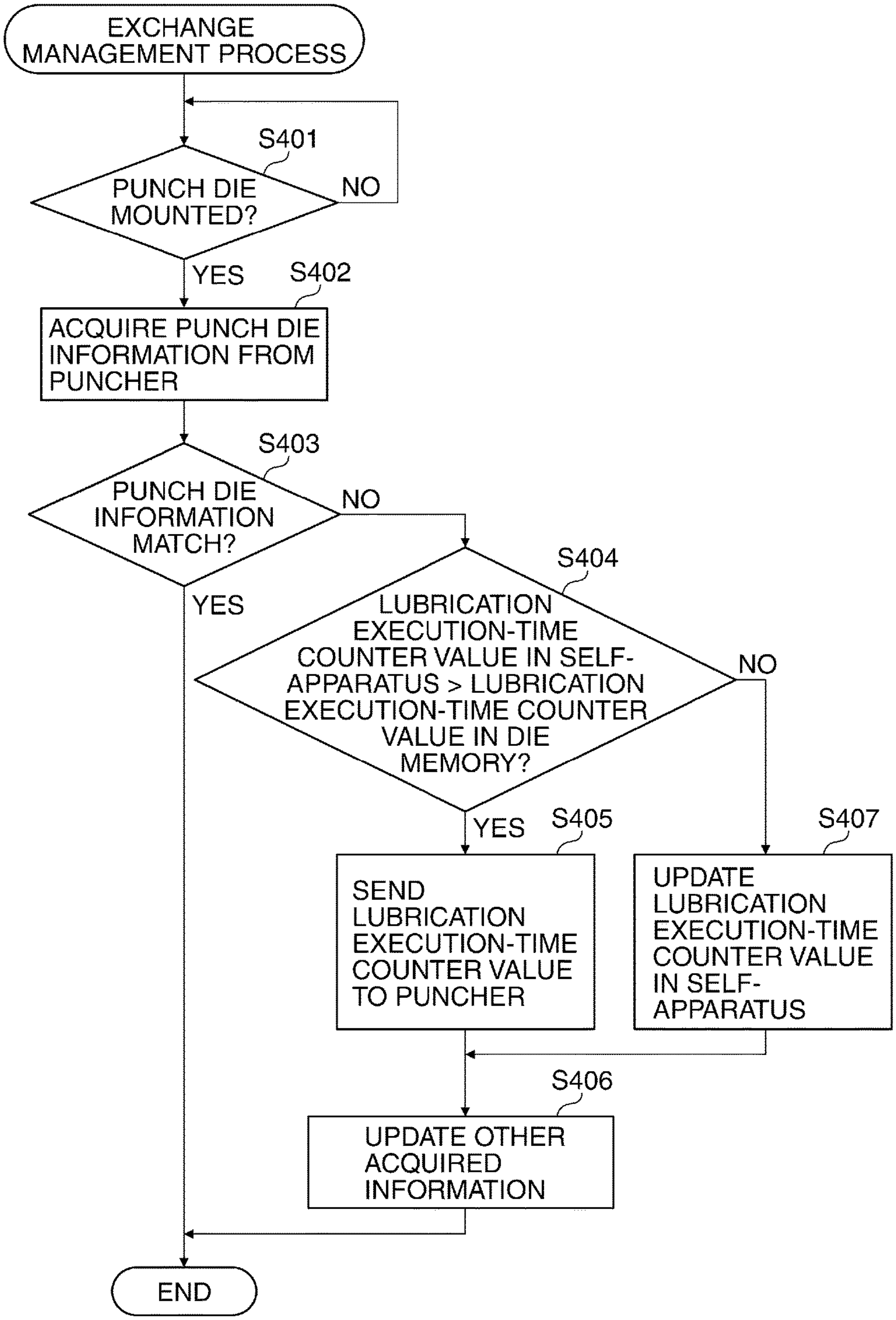
FIG. 18 is a flowchart of an exchange management process performed in the image forming system shown in FIG. 1.

FIG. 18 is a flowchart of the exchange management process performed in the image forming system 1000 shown in FIG. 1.

When the exchange management process is started, first, the CPU 901 determines whether or not a punch die is currently mounted on the puncher 200, and waits until a punch die is mounted on the puncher 200 (step S401). Whether or not a punch die is currently mounted on the puncher 200 is determined based on information sent from the puncher 200 to the CPU 901 of the main controller 900.

After a punch die is mounted on the puncher 200 (YES to the step S401), the CPU 901 acquires punch die information in the format as shown in FIG. 16A from the puncher 200 (step S402). Then, the CPU 901 determines whether or not the punch die information acquired in the step S402 is identical to punch die information stored in the RAM 903 in association with the mounted punch die (step S403). If it is determined in the step S403 that the two pieces of the punch die information are identical to each other, the CPU 901 immediately terminates the present process without updating the information.

At this time, the punch die information stored in the punch die memory 282 is e.g. as shown in FIG. 16D, and the punch die information stored in the RAM 903 is e.g. as shown in FIG. 16E, which means that the two pieces of the die information are identical to each other.

On the other hand, if it is determined in the step S403 that the two pieces of the punch die information are not identical to each other (NO to the step S403), the CPU 901 proceeds to a step S404. When the two pieces of the punch die information are not identical to each other, it is envisaged that the currently mounted punch die was not mounted on the puncher 200 at an immediately preceding lubrication execution time, or that the punch die was mounted again in the puncher 200 of the present system after having been used in a puncher of another system.

If it is determined in the step S403 that the two pieces of the punch die information are not identical to each other, the CPU 901 performs comparison between the lubrication execution-time counter value in the RAM 903, and the lubrication execution-time counter value in the punch die memory 282, which was acquired from the puncher 200 (step S404). More specifically, the CPU 901 determines whether or not the lubrication execution-time counter value in the RAM 903 is larger (newer) than the lubrication execution-time counter value stored in the punch die memory 282. If it is determined in the step S404 that the lubrication execution-time counter value in the RAM 903 is larger (newer) (YES to the step S404), the CPU 901 sends the lubrication execution-time counter value stored in the RAM 903 to the puncher 200 (step S405).

At this time, the CPU 972 of the puncher 200 having received the lubrication execution-time counter value stored in the RAM 903 from the CPU 901 follows the steps S208 and S209 in FIG. 17 to update the lubrication execution-time counter value stored in the punch die memory 282. At this time, the punch die information stored in the punch die memory 282 is updated from the punch die information shown in FIG. 16B to the punch die information shown in FIG. 16D, for example, or from punch die information shown in FIG. 16F to punch die information shown in FIG. 16H, for example.

In the present example, FIG. 16F shows the punch die information associated with the punch die having a die number of "CCCCC", in which the total counter value has been increased due to the use of the punch die in a puncher of another system without having the lubrication execution-time counter value updated (i.e. in the state as shown in FIG. 16B) after execution of lubrication. When the punch die with the punch die information shown in FIG. 16F is mounted on the puncher 200 of the present system, the punch die information stored in the punch die memory 282 of the punch die is compared with the punch die information stored in the RAM 903 of the present system in association with the die number of "CCCCC" (shown in FIG. 16G without any change from FIG. 16C) (step S404). It is judged through the comparison that the lubrication execution-time counter value in FIG. 16G is newer, and therefore the lubrication execution-time counter value in FIG. 16G is sent to the puncher 200. As a consequence, only the lubrication execution-time counter value in the punch die memory 282 is updated, whereby the punch die information in FIG. 16H is obtained.

At this time, on the display section 620, there is displayed the punch die information as shown in FIG. 15C. In FIG. 15C, the lubrication counter value is increased by the number of times (e.g. 100) of punching operation performed in another system after the immediately preceding lubrication execution time.

Referring again to FIG. 18, after having sent the lubrication execution-time counter value stored in the RAM 903 to the puncher 200, the CPU 901 updates the other information stored in the RAM 903 than the lubrication execution-time counter value, with the information stored in the punch die memory (step S406). This updates the punch die information shown in FIG. 16G to punch die information shown in FIG. 16I. More specifically, in FIG. 16I, the lubrication execution-time counter value remains the same as the value shown in FIG. 16G, and only the total counter value is updated with the value shown in FIG. 16H. It is understood from FIG. 16I that the total counter value of the punch die having a die number of "CCCCC" is 2100K and the lubrication counter value after the immediately preceding lubrication is 100.

On the other hand, if it is determined in the step S404 that the lubrication execution-time counter value stored in the RAM 903 is not larger (i.e. older) than the lubrication execution-time counter value stored in the punch die memory 282, the CPU proceeds to a step S407. Since the punch die information acquired from the puncher 200 is newer, the CPU 901 updates the lubrication execution-time counter value stored in the RAM 903, with the lubrication execution-time counter value acquired from the puncher 200 (step S407). Thereafter, the CPU 901 updates the other punch die information (step S406), followed by terminating the present process.

According to the exchange management process in FIG. 18, it is determined whether or not the lubrication execution-time counter value stored in the RAM 903 is larger (newer) than the lubrication execution-time counter value stored in the punch die memory 282 (step S403). If the lubrication execution-time counter value stored in the RAM 903 is larger, the lubrication execution-time counter value is sent to the puncher 200, and the lubrication execution-time counter value stored in the punch die memory 282 is updated. On the other hand, if the lubrication execution-time counter value stored in the RAM 903 is smaller (older) than the lubrication execution-time counter value stored in the punch die memory 282, the lubrication execution-time counter value stored in the RAM 903 is updated with the lubrication execution-time counter value stored in the punch die memory 282 (step S407). This makes it possible to share and manage the lubrication execution-time counter values stored in the respective storage sections of the punch die and the image forming apparatus while constantly updating each of the two values to a new one.

According to the present embodiment, even when a specific punch die as a target for information update is not currently mounted on the present system (NO to the step S305 in FIG. 14), it is possible to update a lubrication execution-time counter value associated with the punch die, on the system side (step S304 in FIG. 14). In this case, when the specific punch die is mounted on the puncher 200, information in the punch die memory of the specific punch die is rewritten with information stored in a memory of the image forming apparatus (step S405 in FIG. 18, and step S209 in FIG. 17). Thus, even when the specific punch die is not currently mounted on the puncher 200, it is possible to properly manage the lubrication execution-time counter without requiring troublesome work at a lubrication time, and notify the user of the need for lubrication before a next lubrication time to thereby call the attention of the user to execution of lubrication. Further, it is possible to reduce work time required for lubrication operation and subsequent information update.

Further, according to the above-described embodiment, even in a case where the use of a specific punch die is shared in a plurality of punchers of a plurality of systems, it is possible to properly manage the lubrication execution-time counter.

In the present embodiment, it is preferable that the sheet P has an image formed, transferred, and fixed on at least one side of the front and reverse sides thereof, in the image forming apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-162096 filed Aug. 19, 2015 which is hereby incorporated by reference herein in its entirety.

What is claimed is:

1. An image forming system comprising:

an image forming apparatus configured to form an image on a sheet;

a punching apparatus configured to form punched holes in the sheet having the image formed thereon, using a punch die removably mounted thereon;

a first memory, mounted on the punch die, configured to store maintenance information including a first information concerning lubrication timing at which the punch die has been lubricated;

a detector configured to detect whether or not a punch die is mounted on said punching apparatus;

a second memory configured to store maintenance information including a second information concerning lubrication timing at which the punch die mounted on said punching apparatus has been lubricated; and a controller configured to, when said detector detects that a punch die is mounted on said punching apparatus, compare the first information with the second information, and update, when the lubrication timing indicated by the second information is older than the lubrication timing indicated by the first information second information stored in said second memory to the first information stored in said first memory.

2. The image forming system according to claim 1, wherein when the lubrication timing indicated by the second information is newer than the lubrication timing indicated by the first information, said controller updates the first information stored in said first memory to the second information stored in said second memory.

3. The image forming system according to claim 1, wherein said second memory stores respective pieces of maintenance information on a plurality of punch dies ever mounted on said punching apparatus.

4. The image forming system according to claim 3, wherein said first memory stores an identification information item for identifying a punch die, and said second memory stores respective pieces of maintenance information on a plurality of punch dies on a punch die-by-punch die basis in association with identification information items, respectively.

5. The image forming system according to claim 4, further comprising a console configured to input an instruction for updating the maintenance information, and wherein when an instruction for updating maintenance information on a punch die currently mounted on said punching apparatus is input from said console, said controller updates second information associated with an identification information item of the punch die mounted on said punching unit, out of the plurality of pieces of maintenance information on the plurality of punch dies stored in said second memory in association with the identification information items.

6. The image forming system according to claim 5, wherein when the instruction is input from the console, said controller updates the first information stored in said first memory mounted on the punch die which is mounted on the punching apparatus.

7. The image forming system according to claim 4, further comprising a condole configured to input an instruction for updating the maintenance information corresponding to a punch die selected from among the plurality of punch dies, and wherein even if the punch die selected by the instruction is not mounted on said punching apparatus, said controller updates the maintenance information corresponding to the selected punch die stored in the second memory.

8. The image forming system according to claim 1, wherein the first information and the second information are information indicative of a number of times of punching operation performed before lubrication is performed on the punch die.

9. The image forming system according to claim 4, wherein the identification information item is information uniquely assigned to the punch die.

10. The image forming system according to claim 4, wherein the identification information item is information indicative of a type of punched holes formed by the punch die.

* * * * *